(12) United States Patent
Pagliato et al.

(10) Patent No.: US 7,075,844 B2
(45) Date of Patent: Jul. 11, 2006

(54) PARALLEL SENSE AMPLIFIER WITH MIRRORING OF THE CURRENT TO BE MEASURED INTO EACH REFERENCE BRANCH

(75) Inventors: Mauro Pagliato, Bollate (IT); Massimo Montanaro, Pavia (IT); Paolo Rolandi, Voghera (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 133 days.

(21) Appl. No.: 10/762,195

(22) Filed: Jan. 20, 2004

(65) Prior Publication Data
US 2004/0228179 A1    Nov. 18, 2004

(30) Foreign Application Priority Data
Jan. 20, 2003  (IT) .................... MI2003A0075

(51) Int. Cl.
*G11C 7/02* (2006.01)
(52) U.S. Cl. .................. 365/207; 365/205; 365/202; 365/208; 365/189.09; 365/196
(58) Field of Classification Search ............... 365/207, 365/205, 202, 208, 189.09, 196
See application file for complete search history.

(56) References Cited

U.S. PATENT DOCUMENTS

| | | | | |
|---|---|---|---|---|
| 5,485,422 A | * | 1/1996 | Bauer et al. ........... | 365/185.21 |
| 5,541,879 A | * | 7/1996 | Suh et al. ............... | 365/185.22 |
| 5,594,691 A | * | 1/1997 | Bashir .................... | 365/185.03 |
| 5,684,732 A | * | 11/1997 | Sako ......................... | 365/96 |
| 5,729,490 A | * | 3/1998 | Calligaro et al. ....... | 365/185.03 |
| 5,898,617 A | * | 4/1999 | Bushey et al. ........... | 365/185.2 |
| 6,044,019 A | * | 3/2000 | Cernea et al. .......... | 365/185.21 |
| 6,122,212 A | * | 9/2000 | Bui et al. ................ | 365/207 |
| 6,128,225 A | | 10/2000 | Campardo et al. | |
| 6,229,383 B1 | * | 5/2001 | Ooishi .................... | 327/540 |
| 6,282,120 B1 | * | 8/2001 | Cernea et al. .......... | 365/185.21 |
| 6,459,613 B1 | * | 10/2002 | Lin et al. ............... | 365/185.03 |
| 6,567,330 B1 | * | 5/2003 | Fujita et al. ........... | 365/210 |
| 6,597,598 B1 | * | 7/2003 | Tran et al. .............. | 365/94 |
| 6,657,889 B1 | * | 12/2003 | Subramanian et al. ... | 365/158 |
| 6,657,895 B1 | * | 12/2003 | Pagliato et al. ........ | 365/185.21 |
| 6,822,906 B1 | * | 11/2004 | Confalonieri .......... | 365/185.21 |
| 6,856,547 B1 | * | 2/2005 | Poidomani et al. .... | 365/185.21 |
| 6,873,551 B1 | * | 3/2005 | Bedarida et al. ....... | 365/185.21 |
| 6,946,882 B1 | * | 9/2005 | Gogl et al. ............. | 327/53 |

* cited by examiner

*Primary Examiner*—Viet Q. Nguyen
(74) *Attorney, Agent, or Firm*—Lisa K. Jorgenson; Bryan A. Santarelli; Graybeal Jackson Haley LLP

(57) ABSTRACT

A parallel sense amplifier includes a measuring branch for receiving an input current to be measured, a plurality of reference branches each one for receiving a reference current, and a plurality of comparators each one for comparing a voltage at a measuring node along the measuring branch with a voltage at a reference node along a corresponding reference branch; the amplifier further includes a multiple current mirror for mirroring the input current into each reference branch.

30 Claims, 4 Drawing Sheets

PARALLEL SENSE AMPLIFIER WITH MIRRORING OF THE CURRENT TO BE MEASURED INTO EACH REFERENCE BRANCH

PRIORITY CLAIM

This application claims priority from Italian patent application No. MI2003A 000075, filed Jan. 20, 2003, which is incorporated herein by reference.

TECHNICAL FIELD

The present invention relates generally to a parallel sense amplifier.

BACKGROUND

Sense amplifiers are commonly used in several applications, such as for reading non-volatile memory devices. A sense amplifier consists of a circuit that can measure an input signal at low level (such as a current).

A standard sense amplifier compares the input current with a reference value. For example, in a non-volatile memory device, the current provided by a selected memory cell is compared with the current provided by a reference cell. Typically, the sense amplifier includes a current mirror with unbalanced loads. A portion of the reference current provided to an input branch (generally one half of the reference current) is mirrored into an output branch connected to the memory cell. In this way, the voltage at a node of the output branch increases or decreases according to whether the current of the memory cell is lower or higher than one half of the reference current. A comparator compares this voltage with a voltage at a node of the input branch and determines the value stored in the memory cell accordingly.

However, the structure described above cannot be used in a parallel sense amplifier, wherein the input current must be compared with multiple reference values at the same time; a typical application of this sense amplifier is the reading in parallel mode of a non-volatile multilevel memory device. Indeed, in this case it is difficult to impossible to mirror the different reference currents (provided to respective input branches) into the same output branch connected to the memory cell.

A known solution is that of using a load including a diode-connected transistor in each branch of the sense amplifier (both the input branch and the output branch). In this way, each reference current is mirrored into an input terminal of a corresponding comparator, while the current of the memory cell is mirrored into the other input terminals of all the comparators. The currents being input to each comparator generate a corresponding voltage, which allow establishing whether the current of the memory cell is lower or higher than the corresponding reference current. The combination of the results of the different comparisons identifies the value stored in the memory cell.

A drawback of the structure described above is that the voltages being input to the different comparators typically have very low values (since the load transistors in the corresponding current mirrors exhibit a negligible resistance). Therefore, the sense amplifier is rather inaccurate.

Moreover, the several current mirrors consume a relatively high amount of static power. These current mirrors also introduce further inaccuracies owing to the unavoidable tolerances of the manufacturing processes.

A different sense amplifier (of the non-parallel type) is described in U.S. Pat. No. 6,128,225. In this case, the current of the memory cell is provided to the input branch of the current mirror so as to be reflected to the output branch connected to the reference cell. Nevertheless, this sense amplifier can be used only in a standard memory device. Indeed, the current mirror has unbalanced loads. Therefore, the sense amplifier is incompatible with a parallel sense amplifier (particularly, for use in a multilevel memory device).

SUMMARY

An embodiment of the present invention is a parallel sense amplifier that overcomes the above-mentioned drawbacks. Briefly, the parallel sense amplifier includes a measuring branch for receiving an input current to be measured, a plurality of reference branches each for receiving a corresponding reference current, and a plurality of comparators each for comparing a voltage at a measuring node along the measuring branch with a voltage at a reference node along a corresponding reference branch; the amplifier further including a multiple current mirror for mirroring the input current into each reference branch.

Moreover, a memory device comprising the sense amplifier and a corresponding method of operating the sense amplifier are also encompassed.

BRIEF DESCRIPTION OF THE DRAWINGS

Further features and advantages of the present invention will be made clear by the following description of embodiments thereof, given purely by way of a non-restrictive example, with reference to the attached figures, in which.

DETAILED DESCRIPTION

Figure 1:
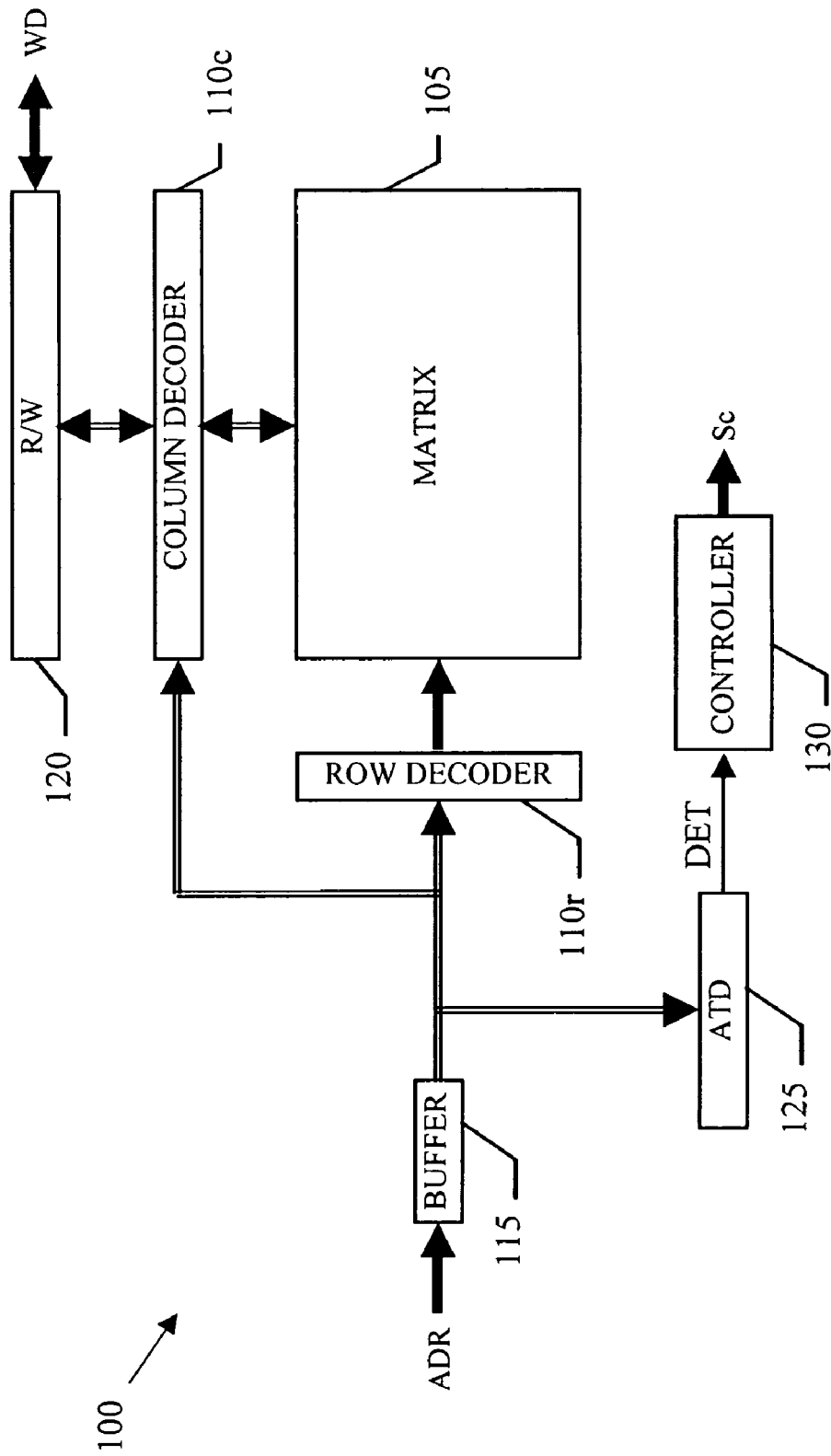
FIG. 1 is a schematic block diagram of a memory device in which a sense amplifier according to an embodiment of the present invention can be used.

With reference in particular to FIG. 1, a non-volatile multilevel memory device 100 (for example, an asynchronous EPROM) is shown according to an embodiment of the invention. The memory device 100 includes a matrix of memory cells 105. Each memory cell consists of a floating gate MOS transistor (not shown in FIG. 1). The memory cell can be programmed to multiple levels, which are associated with corresponding ranges of its threshold voltage (depending on the electrical charge accumulated in the floating gate). Each level represents a different logical value; for example, the memory cell may support 4 levels, so that it stores a logical value that includes 2 bits of information $B_1B_0$ (11, 10 01 and 00 for increasing threshold voltages). The matrix 105 is partitioned into a plurality of sectors (for example, 16 sectors each one storing 4 M bits). For each sector, the matrix 105 includes a set of reference cells, which are programmed to preset threshold voltages.

A column decoder 110c and a row decoder 110r are used for selecting a set of memory cells of the matrix 105 in response to an address ADR; for example, the set may include 8 memory cells, which store a word WD of 16 bits.

The address ADR is received asynchronously from outside the memory device 100; the address ADR is applied to a buffer 115, which drives the decoders 110c and 110r accordingly. The column decoder 110c also interfaces with a reading and writing unit (R/N) 120; the unit 120 includes the circuits that are needed for reading a word WD from and for writing a word WD to the selected memory cells.

The address ADR in the buffer 115 is also provided to an Address Transition Detection (ATD) circuit 125; the ATD circuit 125 generates a detecting pulse DET whenever the address ADR switches. The detection pulse DET is applied to a controller 130, which outputs a sequence of control signals (denoted as a whole with Sc) for the other units of the memory device 100; for example, the controller 130 triggers the execution of a reading operation from the matrix 105 in response to the detection pulse DET.

For this purpose, each selected memory cell is suitably biased so as to supply a current Im corresponding to the logical value that is stored. Particularly, the memory cell at the logical value 11 exhibits a low threshold voltage, and therefore supplies a high current Im; the current Im lowers as the threshold voltage increases, until ideally it is zero when the memory cell is at the logical value 00. Each pair of adjacent logical values is discriminated by a reference current $Ir_j$ (with j=0 . . . 2 in the case at issue), which is provided by a corresponding reference cell; for example, the memory cell is deemed at the level 10 when its current Im is between the reference current $Ir_1$ and the reference current $Ir_2$. To this end, for each selected memory cell the reading and writing unit 120 includes a parallel sense amplifier; as described in detail in the following, the sense amplifier simultaneously compares the cell current Im with the reference currents $Ir_0$–$Ir_2$.

However, the concepts disclosed herein are also applicable when the memory device has another architecture or it is of a different type (for example, a flash $E^2PROM$). Similar considerations apply if the memory cells are programmable to another number of levels (also different from a power of 2), if the matrix is partitioned into a different number of sectors, if the sectors and/or the words have different size, and the like.

Figure 2:
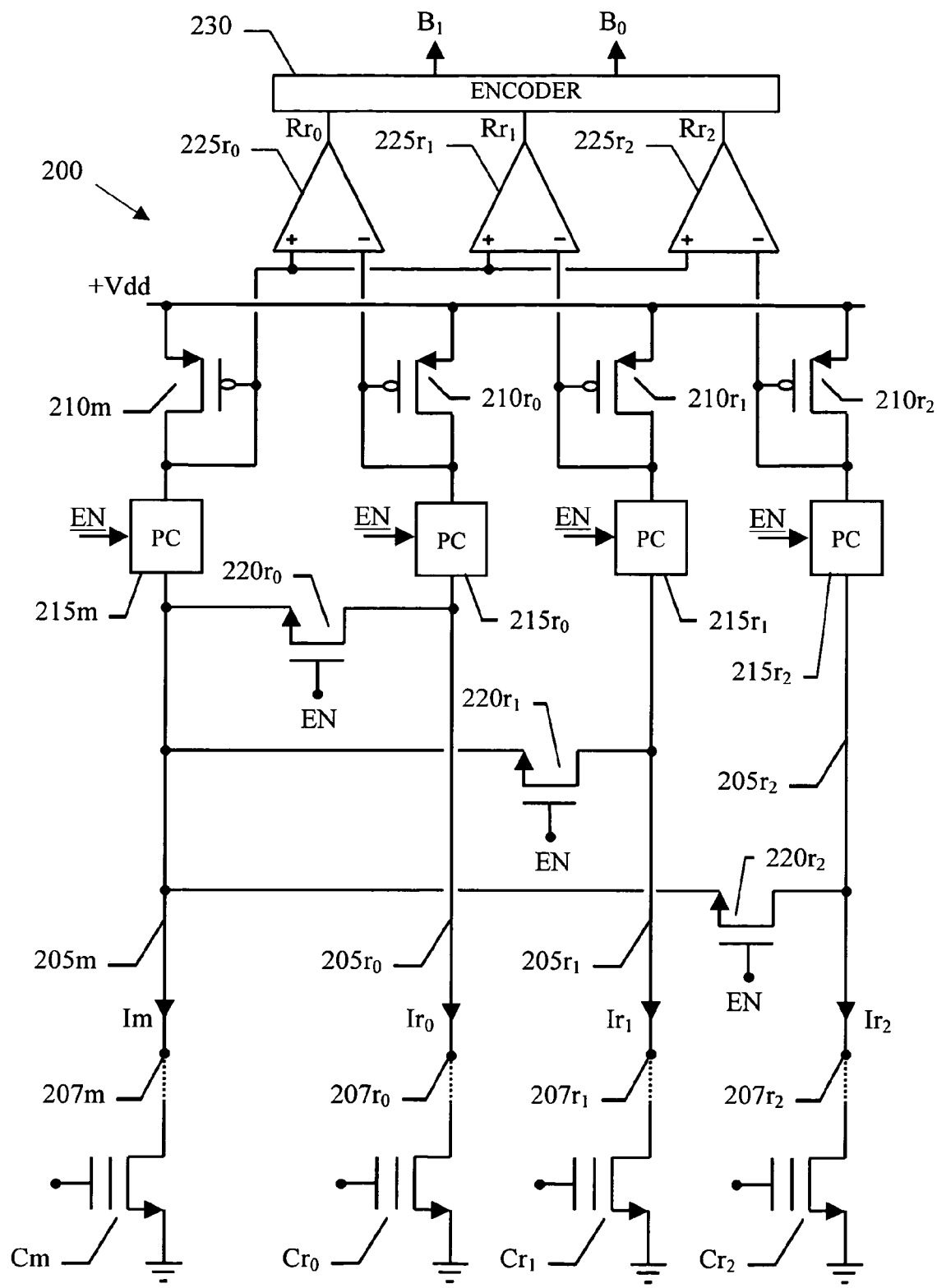
FIG. 2 shows a sense amplifier known in the art.

Considering now FIG. 2, a parallel sense amplifier 200 known in the art is shown. The sense amplifier 200 includes a matrix branch 205m, which receives the cell current Im at its input node 207m; three reference branches $205r_0$–$205r_2$ instead receive the corresponding reference currents $Ir_0$–$Ir_2$ at their respective input nodes $207r_0$–$207r_2$. In the figure, a selected memory cell Cm and three reference cells $Cr_0$–$Cr_2$ (which provide the reference currents $Ir_0$–$Ir_2$) are shown as if they were directly connected to the matrix branch 205m and to the corresponding reference branches $205r_0$–$205r_2$, respectively (omitting the column decoder for the sake of simplicity). Each (memory and reference) cell Cm, $Cr_0$–$Cr_2$ has the source terminal that is maintained at a reference voltage (or ground), and the drain terminal that is connected to the corresponding input node 207m, $207r_0$–$207r_2$ of the sense amplifier 200; the control gate terminals of all the cells Cm, $Cr_0$–$Cr_2$ receive a reading voltage equal to a bootstrap voltage, which is higher than a power supply voltage +Vdd of the memory device (for example, 5V and 1.8V with respect to ground).

Each branch 205m, $205r_0$–$205r_2$ includes a corresponding diode-connected PMOS transistor 210m, $210r_0$–$210r_2$. Particularly, the transistors 210m, $210r_0$–$210r_2$ have respective source terminals that are connected to a power supply terminal (which provides the voltage +Vdd), and the gate terminals that are short-circuited to their drain terminals.

A pre-charging block (PC) 215m, $215r_0$–$215r_2$ is connected in series to each transistor 210m, $210r_0$–$210r_2$ (between the drain terminal of the transistor 210m, $210r_0$–$210r_2$ and the input terminal 207m, $207r_0$–$207r_2$). Each pre-charging block 215m, $215r_0$–$215r_2$ is used to bring the voltage at the drain terminal of the corresponding cell Cm, $Cr_0$–$Cr_2$ towards the correct biasing value (for example, 1V) very fast. Moreover, an equalizing NMOS transistor $220r_0$–$220r_2$ joins each reference branch $205r_0$–$205r_2$ to the matrix branch 205m. Particularly, each equalizing transistor $220r_0$–$220r_2$ has a drain terminal that is connected to the corresponding input node $207r_0$–$207r_2$ and a source terminal that is connected to the input node 207m.

The gate terminals of the equalizing transistors $220r_0$–$220r_2$ are controlled by an enabling signal EN and the pre-charging blocks 215m, $215r_0$–$215r_2$ are controlled by the same enabling signal being negated $\overline{EN}$ (the signal EN is at the logical level 0 when deasserted and at the logical level 1 when asserted; conversely, the signal $\overline{EN}$ is at the logical level 1 when deasserted and at the logical level 0 when asserted). The enabling signals EN,$\overline{EN}$ are asserted at the beginning of the reading operation (by the controller of the memory device in response to the detection pulse DET); those signals EN,$\overline{EN}$ have a length ensuring that the sense amplifier 200 is brought to a correct starting condition.

A respective comparator $225r_0$–$225r_2$ (including a differential amplifier) is associated with each reference branch $205r_0$–$205r_2$. Particularly, the inverting input terminal of each comparator $225r_0$–$225r_2$ is connected to the drain terminal of the corresponding transistor $210r_0$–$210r_2$; the non-inverting input terminals of all the comparators $225r_0$–$225r_2$ are instead connected to the drain terminal of the transistor 210m. In this way, each transistor 210m, $210r_0$–$210r_2$ forms a current mirror with a corresponding transistor within the comparator $225r_0$–$225r_2$ to which it is connected. The output terminal of each comparator $225r_0$–$225r_2$ generates a signal $Rr_0$–$Rr_1$ indicative of the result of the comparison; those comparison signals $Rr_0$–$Rr_1$ are applied to an encoder 230, which provides the bits $B_1B_0$ stored in the memory cell Cm.

During the reading operation, the cell current Im is mirrored into the non-inverting input terminals of all the comparators $225r_0$–$225r_2$; at the same time, each reference current $Ir_0$–$Ir_2$ is mirrored into the inverting input terminal of the corresponding comparator $225r_0$–$225r_2$. The comparators $225r_0$–$225r_2$ then perform a current measure; particularly, the comparison signal $Rr_0$–$Rr_2$ of each comparator $225r_0$–$225r_2$ is asserted when the cell current Im is higher than the corresponding reference current $Ir_0$–$Ir_2$. In this way, the combination of the comparison signals $Rr_0$–$Rr_2$ univocally identifies the level of (i.e., the data stored in) the memory cell Cm (with the corresponding logical value $B_1B_0$ that is then obtained by the encoder 230).

Figure 3A:
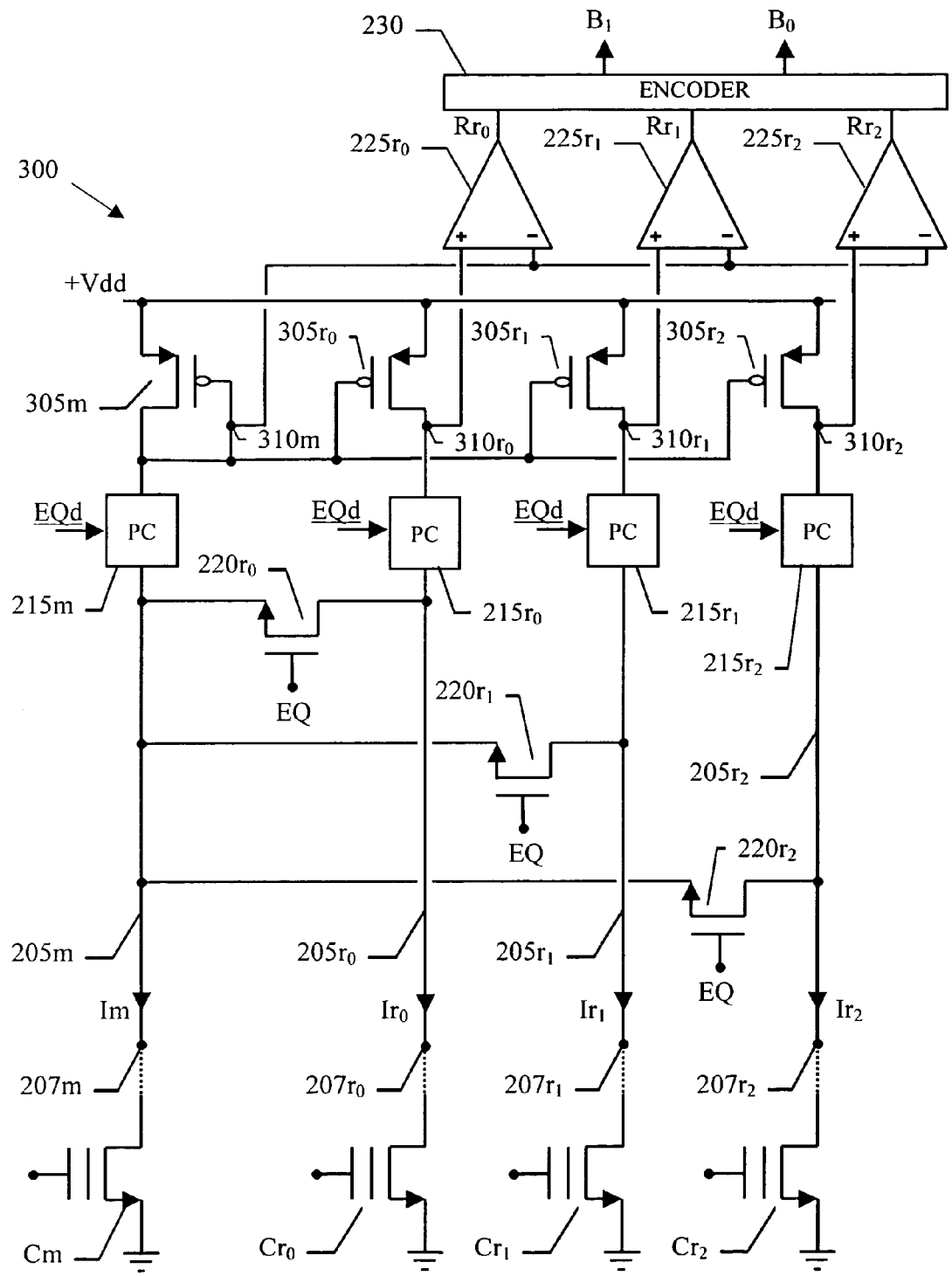
FIG. 3a is a simplified circuit scheme of a sense amplifier according to an embodiment of the invention.

Referring to FIG. 3a, a sense amplifier 300 according to an embodiment of the present invention is instead shown (the elements corresponding to the ones shown in FIG. 2 are denoted with the same references and their explanation is omitted for the sake of brevity). In sharp contrast to the solution known in the art (FIG. 2), the sense amplifier 300 includes a multiple current mirror; this current mirror has an input branch being included in the matrix branch 205m and three output branches each one being included in a corresponding reference branch $205r_0$–$205r_2$.

Particularly, only the matrix branch 205m has a PMOS transistor 305m (corresponding to the transistor 210m of FIG. 2) that is diode-connected; the reference branches $205r_0$–$205r_2$ instead include PMOS transistors $305r_0$–$305r_2$ (corresponding to the transistors $210r_0$–$210r_2$ of FIG. 2) having their gate terminals that are connected to the gate terminal of the transistor $305m$. The transistors $305m$, $305r_0$–$305r_2$ have substantially the same size; as a consequence, the mirror factor of the structure so obtained (between the input branch and each output branch) is equal to 1.

Contrary to the preceding case, the drain terminal of the transistor $305m$ (node $310m$) is connected to the inverting input terminal of all the comparators $225r_0$–$225r_2$, while the drain terminal of each transistor $305r_0$–$305r_2$ (node $310r_0$–$310r_2$) is connected to the non-inverting input terminal of the corresponding comparator $225r_0$–$225r_2$.

Moreover, the gate terminals of the equalizing transistors $220r_0$–$220r_2$ are now controlled by an enabling signal EQ, while the pre-charging blocks $215m$, $215r_0$–$215r_2$ are controlled by a different (negated) enabling signal EQd (which signals are generated by the controller of the memory device, as described in detail below).

During the reading operation, the cell current Im (in the matrix branch $205m$) is mirrored into all the reference branches $205r_0$–$205r_2$.

For each reference branch $205r_j$, let us consider the case in which the cell current Im is higher than the reference current $Ir_j$. During a transient phase, the difference between the cell current Im and the reference current $Ir_j$ loads a stray capacitor associated with the node $310r_j$; the voltage at this node $310r_j$ then raises towards the power supply voltage +Vdd, updating the biasing condition of the transistor $305r_j$. In a steady state, the transistor $305r_j$ will then work in the resistive zone conducting the current $Ir_j$ supplied by the reference cell $Cr_j$ (with the structure $305m$, $305r_j$ that does not operate as a current mirror any longer). As a consequence, the voltage at the non-inverting input terminal of the corresponding comparator $225r_j$ is higher than the voltage at its inverting input terminal, so that the comparison signal $Rr_j$ is asserted.

The opposite situation arises when the cell current Im is lower than the reference current $Ir_j$. During a transient phase, the difference between the reference current $Ir_j$ and the cell current Im discharges the stray capacitor associated with the node $310r_j$; the voltage at this node $310r_j$ then lowers towards ground, updating the biasing condition of the reference cell $Cr_j$. In a steady state, the reference cell $Cr_j$ will then supply the cell current Im forced by the current mirror $305m$, $305r_j$. As a consequence, the voltage at the non-inverting input terminal of the corresponding comparator $225r_j$ is lower than the voltage at its inverting input terminal, so that the comparison signal $Rr_j$ is deasserted.

In this way, the above-described structure implements a current-to-voltage conversion with a gain on an input stage of the sense amplifier 300. The comparators $225r_0$–$225r_2$ then perform a voltage measure on values that are relatively high. This ensures a good sensitivity of the sense amplifier 300 (even with power supply voltages of low value).

Such a characteristic may be particularly important during a writing operation on the memory device. Typically, the writing of a word is obtained through a series of programming steps, each one followed by a verification of the values actually stored in the selected memory cells. The verification is performed reading the written word with a safety margin, wherein the cell current Im is compared with reference currents corresponding (for each logical value) to narrower ranges of the distribution of its threshold voltage. In this case, it is then necessary to discriminate current differences of very low value.

Moreover, it should be noted that in the above-described structure only the gate terminal of the transistor $305m$ is connected as an input to the comparators $225r_0$–$225r_2$. Therefore, owing to the capacitive coupling between this gate terminal and the power supply terminal (due to a corresponding stray capacitor), any noise on the power supply voltage +Vdd is reflected identically into the voltage at the inverting input terminals of all the comparators $225r_0$–$225r_2$. Conversely, the gate terminals of the transistors $305r_0$–$305r_2$ are not connected as an input to the comparators $225r_0$–$225r_2$ any longer; therefore, the voltage at the non-inverting input terminals of the respective comparators $225r_0$–$225r_2$ is less affected, or not affected at all, by any noise on the power supply voltage +Vdd.

Figure 3B:
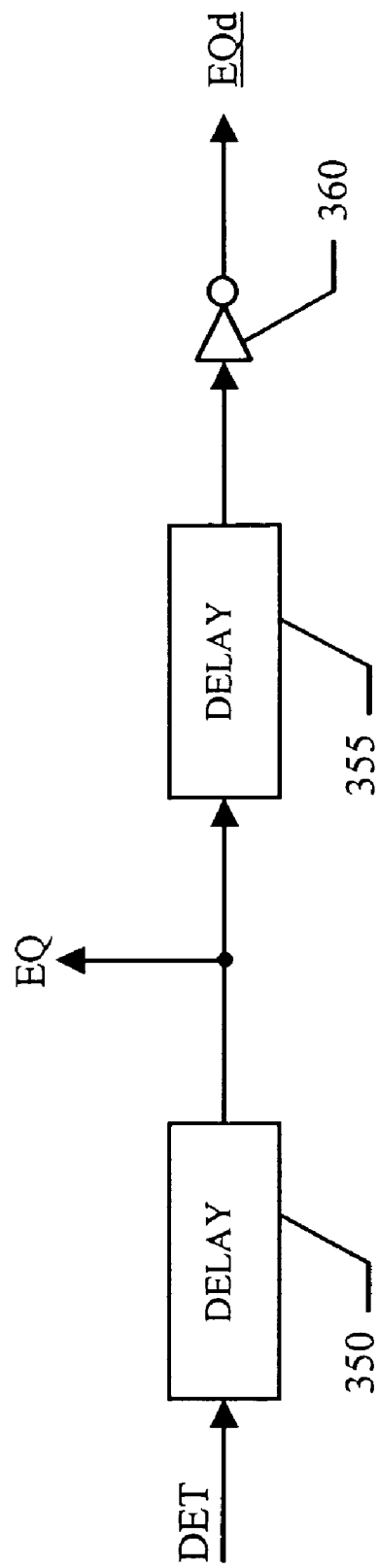
FIG. 3b illustrates functional blocks used for producing some control signals for the sense amplifier of FIG. 3a according to an embodiment of the invention.

As shown in FIG. 3b, the controller of the memory device generates the enabling signals EQ and EQd in response to the detection pulse DET according to an embodiment of the invention. Particularly, the detection pulse DET is provided to a delay generator 350, which outputs the enabling signal EQ; the enabling signal EQ consists of a square wave that is triggered by the detection pulse DET and has a preset length (for example, some ns).

In turn, the enabling signal EQ is provided to a further delay generator 355, which outputs a signal EQd; the signal EQd switches in response to the enabling signal EQ, and maintains this state for a time that is longer (for example, of some ns) than the length of the enabling signal EQ. The negated enabling signal EQd is then obtained from the signal EQd through an inverter 360.

However, the concepts discussed herein are also applicable when the PMOS transistors are replaced with NMOS transistors, and vice-versa, or when the sense amplifier includes equivalent components. Similar considerations apply if equalization blocks with a different structure are provided, if the enabling signals are in phase, and the like.

More generally, a parallel sense amplifier according to an embodiment of the invention includes a measuring branch for receiving an input current to be measured, and a plurality of reference branches each one for receiving a reference current. Moreover, a plurality of comparators are provided, each one for comparing a voltage at a measuring node along the measuring branch with a voltage at a reference node along a corresponding reference branch. The amplifier further includes a multiple current mirror for mirroring the input current into each reference branch.

Such a parallel sense amplifier typically ensures a high accuracy (thanks to the current-to-voltage conversion with a gain on the input stage, which allows the comparators to perform a voltage measure on relatively high values).

The reduction of the mirror branches significantly cuts down the power consumption in a static condition. This also avoids any inaccuracies due to the tolerances of the manufacturing processes.

Moreover, such a parallel sense amplifier is typically substantially insensitive to the noise on the power supply voltage.

The embodiments of the invention described above offer further advantages.

Particularly, the current mirror has a mirroring factor equal to 1.

This sense amplifier is specifically designed for use in a non-volatile multilevel memory device.

A suggested choice for the implementation of the current mirror envisages a single diode-connected transistor (in the input branch).

The proposed structure is particularly simple and compact.

The different transistors have substantially the same size.

However, alternative embodiments of the sense amplifier are contemplated; moreover, different sizes of the transistors that form the current mirror (and then a different mirroring factor) are not excluded.

As a further enhancement, the pre-charging blocks and the equalizing blocks may be controlled by enabling signals having a different length.

The longer length of the pre-charging phase typically improves the operation of the sense amplifier.

The enabling signals may be generated using suitable delay generators.

The proposed solution is very simple, but at the same time effective.

However, the sense amplifier according to the above-described embodiment of the present invention lends itself to be implemented generating the enabling signals in a different way, or even with a single enabling signal for both the pre-charging blocks and the equalizing blocks.

The proposed embodiments of the sense amplifier are specifically designed for use in a non-volatile multilevel memory device, although they may be used in other types of memory devices.

Advantageously, the memory device may be of the asynchronous type (in which case, the different enabling signals cited above are generated from an address transition detection signal).

However, different applications of the embodiments of the sense amplifier are not excluded; for example, the sense amplifier can be used in a synchronous memory device, or even in apparatuses of different type (for example, in a sensor).

Furthermore, an electronic system such as a computer system may incorporate a memory device that includes the parallel sense amplifier 300 (or other embodiment of the parallel sense amplifier) according to an embodiment of the invention.

Naturally, in order to satisfy local and specific requirements, a person skilled in the art may apply to the embodiments described above many modifications and alterations all of which, however, are included within the spirit and scope of the invention.

What is claimed is:

1. A parallel sense amplifier including a measuring branch for receiving an input current to be measured, a plurality of reference branches each one for receiving a reference current, and a plurality of comparators each one for comparing a voltage at a measuring node along the measuring branch with a voltage at a reference node along a corresponding reference branch, wherein the amplifier further includes a multiple current mirror for mirroring the input current into each reference branch.

2. The amplifier according to claim 1, wherein the current mirror has a mirroring factor being substantially equal to 1.

3. The amplifier according to claim 1, wherein the current mirror includes an input branch having an input transistor being diode-connected and a plurality of output branches each one having a corresponding output transistor, the input branch being included in the measuring branch and each output branch being included in a corresponding reference branch.

4. The amplifier according to claim 3, wherein each comparator has a first input terminal and a second input terminal, and wherein each transistor has a first terminal, a second terminal and a control terminal, the first terminal of all the transistors being connected to a power supply terminal, the second terminal of the input transistor defining the measuring node being connected to the first input terminal of each comparator and the second terminal of each output transistor defining the corresponding reference node being connected to the second input terminal of the corresponding comparator, and the control terminal of the input transistor being connected to the second terminal of the input transistor and to the control terminals of all the output transistors.

5. The amplifier according to claim 4, wherein the transistors have substantially equal sizes.

6. The amplifier according to claim 1, further including a plurality of pre-charging blocks each one for pre-charging a corresponding branch of the sense amplifier in response to a first enabling signal having a first length, a plurality of equalizing blocks each one for equalizing the measuring branch with a corresponding reference branch in response to a second enabling signal having a second length longer than the first length, and means for generating the first and the second enabling signals.

7. The amplifier according to claim 6, wherein the means for generating the first and the second enabling signals includes first delaying means for generating the first enabling signal in response to a triggering signal of a sensing operation and second delaying means for generating the second enabling signal in response to the first enabling signal.

8. A non-volatile multilevel memory device including a plurality of memory cells each one being programmable to more than two levels, means for selecting at least one memory cell to be read, and at least one parallel sense amplifier according to claim 1 each one for reading a corresponding selected memory cell.

9. The memory device according to claim 8, wherein the memory device is of the asynchronous type and includes means for receiving an address for selecting the memory cells and means for generating a detection pulse in response to an address transition, the first delaying means generating the first enabling signal in response to the detection pulse.

10. A method of operating a parallel sense amplifier including the steps of:

providing an input current to be measured to a measuring branch, providing each one of a plurality of reference currents to a corresponding reference branch, comparing a voltage at a measuring node along the measuring branch with a voltage at a reference node along each reference branch, and mirroring the input current into each reference branch.

11. A sense amplifier, comprising:

an input branch operable to conduct an input current having an amplitude and to generate an input signal that is related to the input current;

a first output branch coupled to the input branch and operable to generate a first output signal that is related to a combination of a first reference current and a first mirror current that is a mirror of the input current; and a comparator circuit coupled to the input and first output branches and operable to determine the amplitude of the input current from the input signal and the first output signal.

12. The sense amplifier of claim 11 wherein:

the input signal comprises an input voltage; and the first output signal comprises a first output voltage.

13. The sense amplifier of claim 11 wherein the first output signal is related to a difference between the first reference current and the first mirror current.

14. The sense amplifier of claim 11 wherein the first output signal is related to a ratio between the first reference current and the first mirror current.

15. A sense amplifier, comprising:
an input branch operable to conduct an input current having an amplitude and to generate an input signal that is related to the input current;
a first output branch coupled to the input branch and operable to generate a first output signal that is related to a combination of a first reference current and a first mirror current that is related to the input current;
a comparator circuit coupled to the input and first output branches and operable to determine the amplitude of the input current from the input signal and the first output signal; and
wherein the first output branch is operable to conduct the smaller of the first reference current and the first mirror current.

16. The sense amplifier of claim 11 wherein the first mirror current is proportional to the input current.

17. The sense amplifier of claim 11 wherein the first mirror current is substantially equal to the input current.

18. The sense amplifier of claim 11 wherein the comparator circuit comprises a first comparator having first and second input nodes and an output node and that is operable to:
receive the input and first output signals on the first and second input nodes, respectively;
generate on the output node a comparison signal having a first state if the input signal is greater than the first output signal; and
generate the comparison signal having a second state if the input signal is less than the first output signal.

19. The sense amplifier of claim 11, further comprising:
a second output branch coupled to the input branch and operable to generate a second output signal that is related to a combination of a second reference current and a second mirror current that is related to the input current; and
wherein the comparator circuit is coupled to the second output branch and is operable to determine the amplitude of the input current from the second output signal.

20. A sense amplifier, comprising:
an input branch operable to conduct an input current having an amplitude and to generate an input signal that is related to the input current;
a first output branch coupled to the input branch and operable to generate a first output signal that is related to a combination of a first reference current and a first mirror current that is related to the input current;
a second output branch coupled to the input branch and operable to generate a second output signal that is related to a combination of a second reference current and a second mirror current that is related to the input current;
a third output branch coupled to the input branch and operable to generate a third output signal that is related to a combination of a third reference current and a third mirror current that is related to the input current; and
a comparator circuit coupled to the input, first output, second output, and third output branches and operable to determine the amplitude of the input current from the input, first output, second output, and third output signals.

21. A sense amplifier, comprising:
an input branch operable to conduct an input current having an amplitude and to generate an input signal that is related to the input current;
a first output branch coupled to the input branch and operable to generate a first output signal that is related to a combination of a first reference current and a first mirror current that is related to the input current;
a comparator circuit coupled to the input and first output branches and operable to determine the amplitude of the input current from the input signal and the first output signal;
a second output branch coupled to the input branch and operable to generate a second output signal that is related to a combination of a second reference current and a second mirror current that is related to the input current;
a third output branch coupled to the input branch and operable to generate a third output signal that is related to a combination of a third reference current and a third mirror current that is related to the input current; and
wherein the comparator circuit is coupled to the second and third output branches and comprises,
a first comparator that is operable to receive the input and first output signals and to generate a comparison signal having a first state if the input signal is greater than the first output signal and having a second state if the input signal is less than the first output signal,
a second comparator that is operable to receive the input and second output signals and to generate a second comparison signal having a third state if the input signal is greater than the second output signal and having a fourth state if the input signal is less than the second output signal,
a third comparator that is operable to receive the input and third output signals and to generate a third comparison signal having a fifth state if the input signal is greater than the third output signal and having a sixth state if the input signal is less than the third output signal; and
an encoder operable to generate from the first, second, and third comparison signals a digital value that represents the amplitude of the input signal.

22. A memory circuit, comprising:
a memory cell operable to generate a read current during a read cycle, the read current representing a data value stored in the memory cell;
a reference cell operable to generate a reference current during the read cycle; and
a sense amplifier operable to be coupled to the memory cell and to the reference cell during the read cycle, the sense amplifier comprising,
an input branch operable to conduct the read current and to generate an input signal that is related to the read current,
an output branch coupled to the input branch and operable to generate an output signal that is related to a combination of the reference current and a current that is a mirror of the read current, and
a comparator circuit coupled to the input and output branches and operable to determine the data value from the input and output signals.

23. An electronic system, comprising:
a processor;
a memory circuit coupled to the processor and including, a memory cell operable to generate a read current during a read cycle, the read current representing a data value stored in the memory cell, a reference cell operable to generate a reference current during the read cycle, and sense amplifier operable to be coupled to the memory cell and to the reference cell during the read cycle, the sense amplifier comprising, an input branch operable to conduct the read current and to generate an input signal that is related to the read current, an output branch coupled to the input branch and operable to generate an output signal that is related to a combination of the reference current and a current that is a mirror of the read current, and a comparator circuit coupled to the input and output branches and operable to determine the data value from the input and output signals.

24. A sense amplifier, comprising:

a supply terminal;

a first transistor having a first node coupled to the supply terminal, a second node operable to receive an input current, and a control node coupled to the second node;

a second transistor having a first node coupled to the supply terminal, a second node operable to be coupled to a first reference-current generator, and a control node coupled to the control node of the first transistor; and a first comparator having a first input node coupled to the second node of the second transistor and having a second input node coupled to the control node of the first transistor.

25. The sense amplifier of claim 24 wherein:

the first and second transistors comprise respective PMOS transistors; and wherein the first and second input nodes of the comparator respectively comprise non-inverting and inverting nodes.

26. The sense amplifier of claim 24, further comprising:

a third transistor having a first node coupled to the supply terminal, a second node operable to be coupled to a second reference-current generator, and a control node coupled to the control node of the first transistor;

wherein the first comparator has an output node;

a second comparator having a first input node coupled to the second node of the third transistor, a second input node coupled to the control node of the first transistor, and an output node; and an encoder coupled to the output nodes of the first and second comparators and operable to generate a digital value that represents the input current.

27. A method, comprising:

generating an input signal in response to an input current;

generating a first output signal in response to a combination of a first reference current and a first output current that is a mirror of the input current; and determining a value of the input current from the input signal and from the first output signal.

28. The method of claim 27, further comprising:

generating the input current with a memory cell during a read cycle; and generating the first reference current with a reference cell during the read cycle.

29. A method, comprising:

generating an input signal in response to an input current;

generating a first output signal in response to a combination of a first reference current and a first output current that is related to the input current;

determining a value of the input current from the input signal and the first output signal; and wherein generating the first output signal comprises conducting the smaller of the first reference current and the first output current through a conductive path, and generating the first output signal at a node of the conductive path.

30. The method of claim 27, further comprising:

generating a second output signal in response to a combination of a second reference current and a second output current that is a mirror of the input current; and wherein determining the value of the input current comprises determining the value of the input current from the input signal and the first and second output signals.

* * * * *